(12) United States Patent
Tsuruta et al.

(10) Patent No.: US 11,378,591 B2
(45) Date of Patent: Jul. 5, 2022

(54) ELECTRICAL CONNECTION DEVICE

(71) Applicant: Kabushiki Kaisha Nihon Micronics, Tokyo (JP)

(72) Inventors: Kenichi Tsuruta, Oita (JP); Takayuki Hayashizaki, Aomori (JP); Koichiro Tokumaru, Oita (JP); Miyuki Tomooka, Oita (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 61 days.

(21) Appl. No.: 17/090,835

(22) Filed: Nov. 5, 2020

(65) Prior Publication Data

US 2021/0140999 A1 May 13, 2021

(30) Foreign Application Priority Data

Nov. 11, 2019 (JP) ............................. JP2019-203749

(51) Int. Cl.
| | |
|---|---|
| *H01R 12/00* | (2006.01) |
| *G01R 1/073* | (2006.01) |
| *H01R 12/71* | (2011.01) |
| *H01R 13/03* | (2006.01) |
| *H05K 1/09* | (2006.01) |
| *H01R 12/70* | (2011.01) |

(52) U.S. Cl.
CPC ....... *G01R 1/07371* (2013.01); *H01R 12/714* (2013.01); *H01R 13/03* (2013.01); *H05K 1/09* (2013.01); *H01R 12/7047* (2013.01); *H01R 2201/20* (2013.01)

(58) Field of Classification Search
CPC ............... H01R 12/585; H01R 4/2429; H01R 20/7073; H01R 9/096; H01R 43/24; H05K 3/368
See application file for complete search history.

(56) References Cited

U.S. PATENT DOCUMENTS

| | | | | | |
|---|---|---|---|---|---|
| 5,718,606 | A | * | 2/1998 | Rigby | ................ H01R 12/7035 439/607.1 |
| 6,062,913 | A | * | 5/2000 | Puerner | .................. H01R 43/20 439/687 |
| 6,491,545 | B1 | * | 12/2002 | Spiegel | .............. H01R 13/6586 439/931 |
| 7,862,348 | B2 | * | 1/2011 | Strauss | .................... H01Q 1/42 439/83 |
| 10,236,635 | B2 | * | 3/2019 | Ju | ........................ H01R 12/714 |
| 10,611,139 | B2 | * | 4/2020 | Burgold | ................. H01R 43/16 |
| 2011/0214900 | A1 | | 9/2011 | Hirano et al. | |

(Continued)

FOREIGN PATENT DOCUMENTS

| | | |
|---|---|---|
| CN | 107667295 A | 2/2018 |
| EP | 3241029 A1 | 11/2017 |

(Continued)

*Primary Examiner* — Phuong Chi Thi Nguyen
(74) *Attorney, Agent, or Firm* — Lorenz & Kopf, LLP

(57) ABSTRACT

An electrical connection device includes: a wiring board in which lands are arranged on a main surface; and probes. Each of the probes has a distal end portion that contacts an object to be measured and a proximal end portion that contacts the land. A material of a surface film of the proximal end portion, which contacts the land, is a metal material different in composition from a material of the land that contacts the surface film.

8 Claims, 3 Drawing Sheets

(56) References Cited

U.S. PATENT DOCUMENTS

| | | | |
|---|---|---|---|
| 2014/0091823 A1 | 4/2014 | Jiko et al. | |
| 2017/0299634 A1 | 10/2017 | Crippa et al. | |
| 2020/0011897 A1 | 1/2020 | Katou | |

FOREIGN PATENT DOCUMENTS

| | | | |
|---|---|---|---|
| JP | 2001289874 A | 10/2001 | |
| JP | 2011117882 A | 6/2011 | |
| JP | 2016217919 A | 12/2016 | |
| KR | 20110035973 A | 4/2011 | |
| KR | 20160028527 A | 3/2016 | |
| KR | 20190113958 A | 10/2019 | |
| TW | 201625963 A | 7/2016 | |

\* cited by examiner

ELECTRICAL CONNECTION DEVICE

CROSS-REFERENCE TO PRIORITY APPLICATION

This application is based upon and claims the benefit of priority from prior Japanese Patent Application P2019-203749 filed on Nov. 11, 2019; the entire contents of which are incorporated by reference herein.

BACKGROUND

Field of the Invention

Embodiments described herein relate generally to an electrical connection device for use in measuring electrical characteristics of an object to be measured.

Description of the Related Art

In order to measure characteristics of an object to be measured such as an integrated circuit, an electrical connection device that includes probes which contact the object to be measured is used. In a measurement using the electrical connection device, one end portion of each of the probes is brought into contact with the object to be measured. Then, other end portion of the probe is brought into contact with each of electrode terminals (hereinafter, referred to as "lands") arranged on a wiring board. The lands connect to a measuring apparatus such as an IC tester. Electrical signals propagate between the object to be measured and the measuring apparatus via the probes and a wiring board.

For each of the probes, a structure is adopted, in which a base film and a surface film are laminated on a surface of a core material. For example, gold (Au) films are used for such surface films of the probes.

A lower electrical resistance is preferable at each of contact areas of the probes and the lands. Therefore, the Au films are used for the lands of the wiring board and the surface films of the probes. However, a problem is caused by the fact that the Au films of the lands and the Au films as the surface films adhere to each other. That is, the surface films of the probes peel off at the time of separating the probes from the lands. Alternatively, the probes fall out of the probe head, which holds the probes, at the time of detaching the probe head from the wiring board.

BRIEF SUMMARY

In accordance with an aspect of the present disclosure, provided is an electrical connection device including: a wiring board in which lands are arranged on a main surface; and probe including distal end portion which contacts an object to be measured, and proximal end portion which contacts the land. A material of surface film of the proximal end portion of the probe, the proximal end portion contacting the land, is different in composition from a material of the land.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
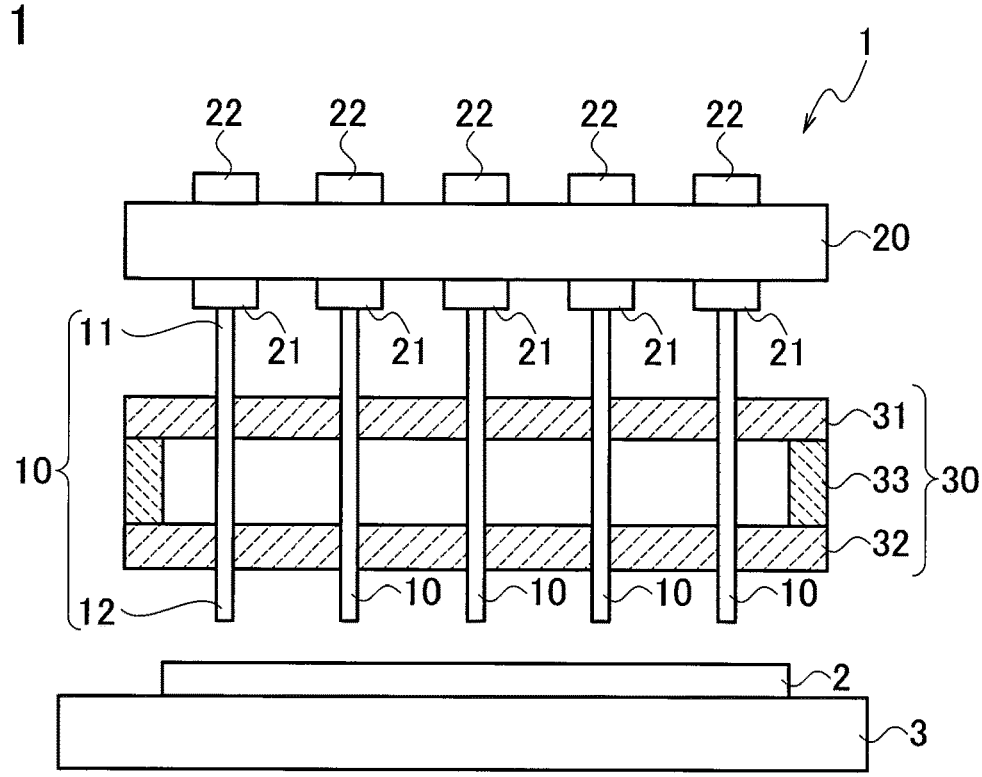
FIG. 1 is a schematic view illustrating a configuration of an electrical connection device according to an embodiment.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this disclosure, and the embodiments of this invention do not specify materials, shapes, structures, dispositions and the like of constituent components to those described below.

An electrical connection device 1 according to an embodiment, which is illustrated in FIG. 1, is used for measuring electrical characteristics of an object to be measured 2. The electrical connection device 1 includes: probes 10; a probe head 30 that holds the probes 10; and a wiring board 20 attached with the probe head 30. The probe head 30 is fixed to the wiring board 20 by bolts (not shown).

The electrical connection device 1 is a vertical operation-type probe card, in which distal end portions 12 of the probes 10 contact electrode pads (not shown) of the object to be measured 2 during measurement of the object to be measured 2. FIG. 1 illustrates a state where the probes 10 are not in contact with the object to be measured 2. During the measurement, for example, a chuck 3 on which the object to be measured 2 is mounted rises, and the distal end portions 12 of the probes 10 contact the object to be measured 2.

Lands 21 made of a conductive material are arranged on a main surface of the wiring board 20, which face the probes 10. Proximal end portions 11 of the probes 10 contact the lands 21. Meanwhile, connection terminals 22 are arranged on other main surface of the wiring board 20. The lands 21 and the connection terminals 22 electrically connect to each other via a wiring pattern (not shown) formed in the wiring board 20. The connection terminals 22 connect to a measuring apparatus (not shown). A printed board or the like is used for the wiring board 20.

For the probe head 30, a structure having a plurality of guide plates, or the like is used. In the probe head 30 illustrated in FIG. 1, a top guide plate 31 and a bottom guide plate 32 are disposed to be spaced apart from each other by a spacer 33 along an extending direction of the probes 10. The probes 10 are held by the probe head 30 in a state of penetrating guide holes formed individually in the top guide plate 31 and the bottom guide plate 32. A material of the probe head 30 is, for example, ceramics.

During the measurement of the object to be measured 2, electrical signals propagate between the measuring apparatus and the object to be measured 2 via the wiring board 20 and the probes 10. For example, via the wiring board 20 and the probes 10, electrical signals are transmitted from the measuring apparatus to the object to be measured 2, and electrical signals output by the object to be measured 2 are transmitted to the measuring apparatus. Therefore, conductive materials are used for the lands 21 and the probes 10.

Figure 2:
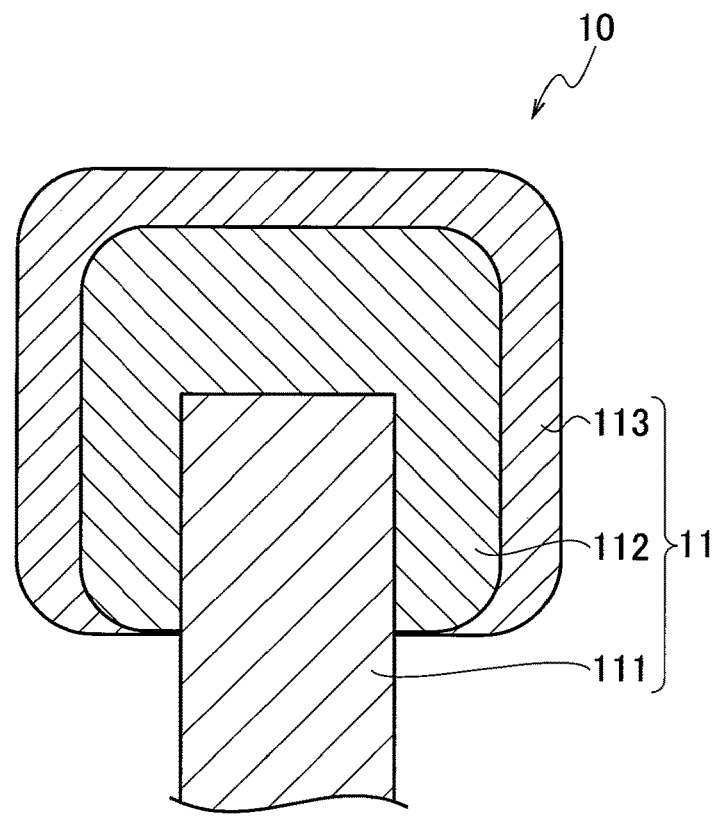
FIG. 2 is a schematic cross-sectional view illustrating a structure of a proximal end portion of a probe of the electrical connection device according to the embodiment.

For the proximal end portions 11 of the probes 10, adopted is a structure of reducing electrical resistance at contact spots of the proximal end portions 11 and the lands 21. For example, as illustrated in FIG. 2, for each of the proximal end portions 11, adopted is a structure including a base film 112 that covers a core material 111, and a surface film 113 that covers the base film 112.

For the core material 111, conductive metal such as a copper (Cu) alloy, a silver-palladium-copper (AgPdCu) alloy, rhodium (Rh) and nickel (Ni) is used. The base film 112 functions as a barrier film that prevents diffusion of metal atoms between the surface film 113, a strike plated film formed between the surface film 113 and the base film 112, and the core material 111, and the like. For example, when Au plated films are used for the surface film 113 and the strike plated film, a Ni film is formed as the base film 112. Thus, Cu can be prevented from being diffused into the Au plated films from the core material 111 made of the Cu alloy or the like. For the base film 112, a titanium (Ti) film, a chromium (Cr) film, palladium (Pd) film and the like are also adoptable as the barrier film on such a Cu—Au interface. Note that the base film 112 may sometimes be unnecessary depending on the material of the core material 111. A conductive metal film is used also for the surface film 113. Although details will be described later, a metal material different in composition from the material of the lands 21 is used for the surface film 113. Moreover, the base film 112 and the surface film 113 are plated on the core material 111, whereby oxidation of the core material 111 made of the Cu alloy can be suppressed.

Figure 3:
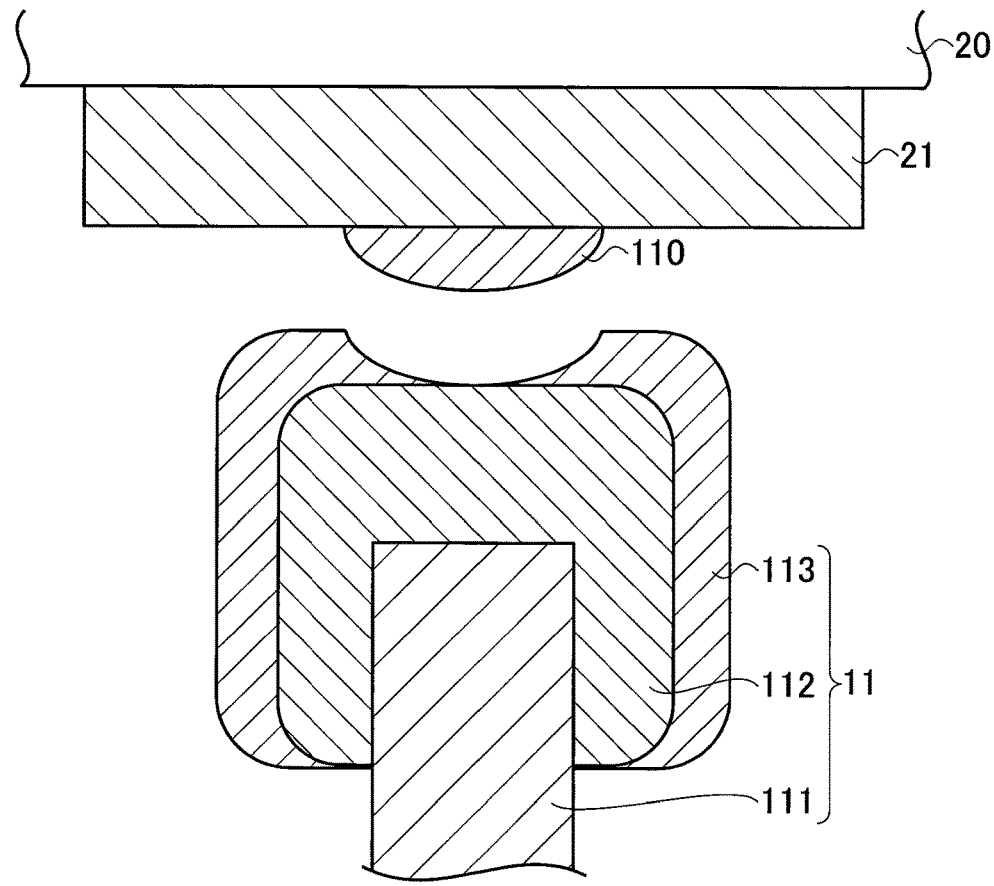
FIG. 3 is a schematic view illustrating peeling of a surface film.

In order to reduce the electrical resistance at the contact spots of the probes 10 and the lands 21, the Au film is used as materials of each surface film 113 and each land 21. However, when the Au films are used individually for the land 21 and the surface film 113 of each probe 10, such a problem occurs that the Au film as the surface film 113 and the Au film of the land 21 adhere to each other. When the Au film of the land 21 and the Au film as the surface film 113 adhere to each other, then as illustrated in FIG. 3, the surface film 113 of the probe 10 peels off at the time of separating the probe 10 from the land 21. An Au film 110 that has peeled off from the probe 10 attaches to the surface of the land 21.

When the object to be measured 2 is repeatedly measured, a phenomenon that the Au film that has peeled off from the probe 10 attaches to the surface of the land 21 is repeated. Therefore, a film thickness of the Au film that has attached to the surface of the land 21 gradually increases. Thus, a contact state of the probe 10 and the land 21 changes, and such a problem as a decrease of measurement accuracy occurs. Moreover, due to the phenomenon that the Au film attaches to the surface of the land 21, heights of a plurality of the lands 21 arranged on the wiring board 20 vary. As a result, positions of the distal end portions 12 of the probes 10 vary, and stylus pressures of the probes 10 which contact the object to be measured 2 become uneven.

Figure 4:
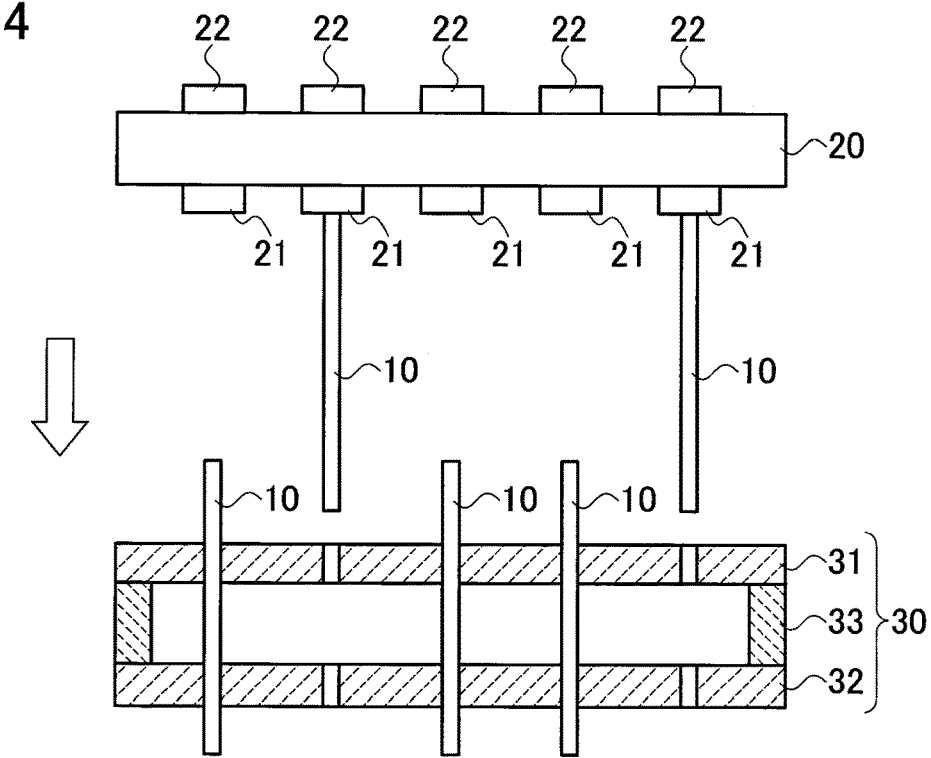
FIG. 4 is a schematic view illustrating a state where the probes fall out of a probe head.

Moreover, when such Au films of the lands 21 and such Au films as the surface films 113 adhere to each other, then as illustrated in FIG. 4, the probes 10 may sometimes fall out of the probe head 30 at the time of detaching the probe head 30 from the wiring board 20 in an arrow direction. In the example illustrated in FIG. 4, the second and fifth probes 10 from the left side of the drawing fall out of the probe head 30.

In contrast, in each probe 10 illustrated in FIG. 1, a material of a portion of the surface film 113, which contacts each land 21, is a metal material different in composition from a material of a portion of the land 21, which contacts the proximal end portion 11. Therefore, the adhesion of the surface film 113 of the probe 10 and the land 21 can be suppressed.

For example, when the material of the land 21 is the Au film, noble metal having conductivity is used for the material of the surface film 113 of the probe 10. Here, "noble metal" is metal other than base metals, and is metal hard to ionize, for example, hard to be oxidized even if being heated in air. Therefore, the conductive noble metal can be suitably used for the material of the surface film 113. For example, for the noble metal for use in the material of the surface film 113, adoptable are a metal selected from a metal group consisting of Pd, iridium (Ir), platinum (Pt), ruthenium (Ru), Rh and the like, an alloy containing the above-described metal, and the like.

For example, when a Cu alloy with a diameter of approximately 30 μm is used for the core material 111, a Ni film with a film thickness of approximately 4.5 μm is used for the base film 112, and a noble metal film with a film thickness of approximately 1.0 μm is used for the surface film 113. Alternatively, when a Cu alloy with a diameter of approximately 35 μm is used for the core material 111, a Ni film with a film thickness of approximately 6.5 μm is used for the base film 112, and a noble metal film with a film thickness of approximately 1.0 μm is used for the surface film 113. The base film 112 and the surface film 113 are formed, for example, by a plating process or the like.

Figure 5:
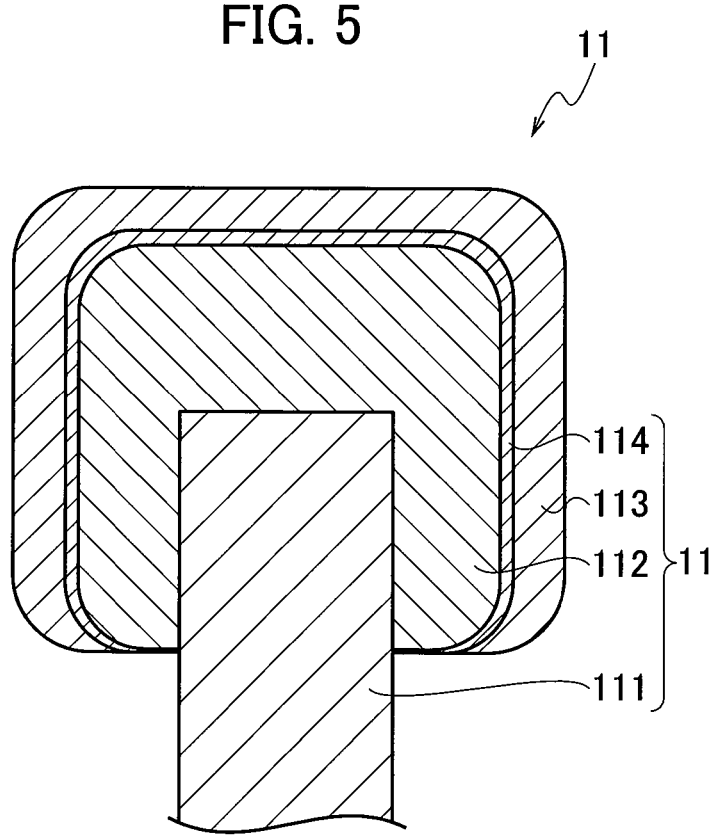
FIG. 5 is a schematic cross-sectional view illustrating another structure of the proximal end portion of the probe of the electrical connection device according to the embodiment.

Note that a contact property of the base film 112 and the surface film 113 may sometimes decrease depending on a material combination of the base film 112 and the surface film 113. In such a case, as illustrated in FIG. 5, a strike plated film 114 may be formed between the base film 112 and the surface film 113. That is, the surface film 113 is not directly formed on the surface of the base film 112, but the strike plated film 114 that covers the surface of the base film 112 is formed. Then, the surface film 113 is formed to cover the strike plated film 114.

The strike plated film 114 is formed on the surface of the base film 112, whereby an immobile coating of the base film 112 can be removed to activate the base film 112. Therefore, a close contact property of the base film 112 and the surface film 113 can be improved. For example, an Au film is used for the strike plated film 114.

Moreover, noble metal having conductivity may be used for the material of the land 21. At this time, noble metal different in composition from the noble metal used for the land 21 is used for the material of the surface film 113 of the probe 10. Alternatively, the Au film may be used for the material of the surface film 113, and the noble metal having conductivity may be used for the material of the land 21. Like the noble metal for use in the material of the surface film 113, the noble metal for use in the material of the land 21 is a metal selected from the metal group consisting of Pd, Ir, Pt, Ru, Rh and the like, an alloy containing the above-described metal, and the like.

As described above, in the electrical connection device 1 according to the embodiment of the present invention, the material of the surface film 113 in the proximal end portion 11 of the probe 10 is a metal material different in composition from the material of the land 21 that contacts the proximal end portion 11. Therefore, in accordance with the electrical connection device 1, the adhesion of the probe 10 and the land 21 of the wiring board 20 can be suppressed.

OTHER EMBODIMENTS

As above, an embodiment of the present invention has been described; however, it should not be understood that the description and the drawings, which form a part of this disclosure, limit the present invention. For those skilled in the art, varieties of alternative embodiments, examples and application technologies will be obvious from this disclosure.

For example, the above description is given of the case of using the noble metals for the materials of the surface film 113 and the land 21; however, metal materials other than the noble metals may be used for the materials of the surface film 113 ad the land 21 if the material of the surface film 113 and the material of the land 21 are different in composition from each other.

As described above, it is natural that the present invention incorporates a variety of embodiments which are not described herein. Hence, the technical scope of the present invention is defined only by items specifying the invention, which are according to the scope of patent claims reasonable based on the above description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electrical connection device for use in measuring electrical characteristics of an object to be measured, comprising:
   a wiring board in which lands made of a conductive material are arranged on a main surface; and
   a probes, each of which has a distal end portion that contacts the object to be measured during measurement and a proximal end portion that contacts the land during the measurement, and in each of which a material of a surface film of the proximal end portion, the surface film contacting the land, is a metal material different in composition from a material of the land that contacts the surface film.

2. The electrical connection device according to 1, wherein the proximal end portion of each if the probes has a structure of including a base film that covers a core material and the surface film that covers the base film.

3. The electrical connection device according to claim 2, wherein a strike plated film is formed between the base film and the surface film.

4. The electrical connection device according to claim 1, wherein the material of at least either one of the surface film and the land is noble metal having conductivity.

5. The electrical connection device according to claim 4, wherein the noble metal is a metal selected from a metal group consisting of palladium, iridium, platinum, ruthenium and rhodium or an alloy containing the metal.

6. The electrical connection device according to claim 4, wherein the material of the surface film is the noble metal, and the material of the land is gold.

7. The electrical connection device according to claim 4, wherein the material of the surface film is gold, and the material of the land is the noble metal.

8. The electrical connection device according to claim 4, wherein the individual materials of the surface film and the land are the noble metals different in composition from each other.

* * * * *